(12) United States Patent
Fujita

(10) Patent No.: US 6,936,915 B2
(45) Date of Patent: Aug. 30, 2005

(54) LEAD FRAME HAVING CHIP MOUNTING PART AND LEADS OF DIFFERENT THICKNESSES

(75) Inventor: Katsufusa Fujita, Fukuoka (JP)

(73) Assignee: Mitsui High-tec, Inc. (JP)

( * ) Notice: Subject to any disclaimer, the term of this patent is extended or adjusted under 35 U.S.C. 154(b) by 0 days.

(21) Appl. No.: 10/399,819

(22) PCT Filed: Nov. 1, 2001

(86) PCT No.: PCT/JP01/09580

§ 371 (c)(1),
(2), (4) Date: Sep. 5, 2003

(87) PCT Pub. No.: WO02/37562

PCT Pub. Date: May 10, 2002

(65) Prior Publication Data

US 2004/0150077 A1 Aug. 5, 2004

(30) Foreign Application Priority Data

Nov. 1, 2000 (JP) .......................... 2000-334512

(51) Int. Cl.⁷ .............................................. H01L 23/48
(52) U.S. Cl. ..................... 257/693; 257/676; 257/690
(58) Field of Search ...................... 257/666, 675–676, 257/690, 693, 696, 670

(56) References Cited

U.S. PATENT DOCUMENTS

| | | | |
|---|---|---|---|
| 5,038,200 A | * 8/1991 | Hosomi et al. | 257/796 |
| 5,973,388 A | * 10/1999 | Chew et al. | 257/676 |
| 6,255,722 B1 | * 7/2001 | Ewer et al. | 257/676 |
| 6,307,272 B1 | * 10/2001 | Takahashi et al. | 257/787 |
| 6,335,548 B1 | * 1/2002 | Roberts et al. | 257/98 |
| 6,388,311 B1 | * 5/2002 | Nakashima et al. | 257/676 |
| 6,667,547 B2 | * 12/2003 | Woodworth et al. | 257/696 |
| 6,703,695 B2 | * 3/2004 | Nakazawa | 257/676 |
| 2001/0033008 A1 | * 10/2001 | Kaneda et al. | 257/666 |

FOREIGN PATENT DOCUMENTS

| | | | | |
|---|---|---|---|---|
| JP | 54-108575 | | 8/1979 | |
| JP | 58-39058 U | | 3/1983 | |
| JP | 59-14896 | | 4/1984 | |
| JP | 01-81258 A | | 3/1989 | |
| JP | 03-132046 | * | 6/1991 | H01L/21/56 |
| JP | 09-246444 | * | 9/1997 | H01L/23/48 |
| JP | 2000-077588 | * | 3/2000 | H01L/23/48 |
| JP | 2004-103790 | * | 4/2004 | H01L/23/50 |

* cited by examiner

Primary Examiner—Anh Duy Mai
(74) Attorney, Agent, or Firm—Wood, Phillips, Katz, Clark & Mortimer

(57) ABSTRACT

A lead frame according to this invention comprises: a semiconductor chip mounting part having an engagement hole formed on its one side; and a lead part including a supporting lead fit in said engagement hole of the semiconductor chip mounting part so as to support said semiconductor chip mounting part, said supporting lead being made of a thinner-walled material than that of the semiconductor chip mounting part and an outer lead arranged in parallel to said supporting lead. The supporting lead involves a fitting portion having a wider width than a lead width of the supporting lead and fit in said engagement hole of said semiconductor chip mounting part.

4 Claims, 4 Drawing Sheets

LEAD FRAME HAVING CHIP MOUNTING PART AND LEADS OF DIFFERENT THICKNESSES

DESCRIPTION

1. Technical Field

This invention relates to a lead frame for a high power transistor and a semiconductor device using the same.

2. Background Art

In a lead frame for a high power transistor, a semiconductor chip mounting part, which must have excellent heat radiation capability, is made of a thick walled material. On the other hand, a supporting lead, which supports the above semiconductor chip mounting part and serves as an outer lead and the outer lead are made of a thin walled material, because the supporting lead and the outer lead are required to be easily connected to an external circuit device such as a printed board and to have excellent moldability.

Conventionally, a lead frame for the above high power transistor has been proposed which is formed of an uneven thickness material having parts with different thicknesses (Post-examined Japanese Patent Publication 59-14896). In such a lead frame, since the semiconductor chip mounting part, supporting lead and outer lead are made of the same material, the lead frame can be relatively easily manufactured. However, such a lead frame presents a problem that it is costly by all means because the uneven thickness material is expensive.

Moreover, another technique has been proposed in which the semiconductor chip mounting part is made of a thick walled material, the supporting lead and outer lead are made of different thin-walled material and the supporting lead and semiconductor chip mounting part are coupled with each other by caulking (JP-A-54-108575).

In such a caulking-coupled lead frame, a groove having a width approximately equal to that of the supporting lead is formed at the ends on the one side of the semiconductor chip mounting part and a tip of the supporting lead is fit in the groove.

Such a configuration has advantages that the production cost can be reduced and that an optimum material with excellent heat radiation can be selected for the semiconductor chip mounting part, whereas materials with excellent workability and wire bonding capability are selected for the supporting lead and outer lead. However, such a configuration presents the following problem.

In the caulking-coupled lead frame, the supporting lead is fit in the groove of the semiconductor chip mounting part. In this case, at this fit portion, a gap or play may be produced to give rise to contact failure. This led to reduction of reliability. In some caulking-coupled lead frames, the coupled semiconductor chip mounting part tilts. This gave rise to a problem in plane-contact with an external heat radiating plate.

Further, there was also a problem that it is difficult to give deep bending to the supporting lead because of low strength of the caulking-coupling so that a great level difference cannot be given between the supporting lead and the semiconductor chip mounting part in a horizontal plane. Therefore, it was difficult to place e.g. a semiconductor chip with high integration and a large thickness.

DISCLOSURE OF THE INVENTION

This invention has been accomplished in view of the above circumstances. and intends to provide a lead frame which can reduce production cost and also can firmly caulking-couple a semiconductor chip mounting part made of a thick-walled material and having excellent heat radiation capability and a supporting lead of a thin-walled material. This invention also intends to provide a lead frame which can give deep bending to a supporting lead so that a great level difference is provided between the supporting lead and semiconductor chip mounting part, can place a semiconductor chip with high integration and shorten the length of a bonding wire.

This invention also intends to provide a lead frame which can prevent an adhesive from leaking out toward a lead side in die bonding for a semiconductor chip mounting part.

This invention is a lead frame including a semiconductor chip mounting part having an engagement hole formed on its one side, the engagement hole having a water than a lead width of a supporting lead; and a lead part including the supporting lead fit in said engagement hole of the semiconductor chip mounting part so as to support said semiconductor chip mounting part, said supporting lead being made of a thinner-walled material than that of the semiconductor chip mounting part and an outer lead arranged in parallel to said supporting lead, said supporting lead involves a fitting portion having a wider width than the lead width of the supporting lead and fit in and caulking-coupled with said engagement hole of said semiconductor mounting part.

The gist of this invention resides in a lead frame comprising: a semiconductor chip mounting part made of a thick-walled material, a supporting lead made of a thin-walled material which supports said semiconductor chip mounting part and serves as an outer lead and the outer lead arranged in parallel to said supporting lead, wherein an engagement hole having a wider width than that of supporting lead is made into the one side along the one side of the semiconductor chip mounting part, and is open from the central portion toward the side ends to be wider than the width of the supporting lead; a fitting portion, which is formed at the tip of the supporting lead, is caulked on the engagement hole and at the side ends thereof so that the supporting lead is coupled with the semiconductor chip mounting part, and the outer side of the supporting lead from the area where it is coupled with said semiconductor chip mounting part is bent so that the surface of the semiconductor chip mounting part is located at a lower level than an extending line of said supporting lead, or the one end thereof is location below the supporting lead.

Another gist of this invention resides in a lead frame in which a through-hole is made in the one side along the one side of the semiconductor chip mounting part so as to have a width equal to or longer than that of the semiconductor chip to be mounted; an opening is formed from the center position of the through-hole toward the ends of the side so as to be wider than the lead width of the supporting lead; and in the through-hole and the opening between the side ends, a fitting portion, which is formed at the tip of the supporting lead, is fit to sink so that the through-hole forms a groove from the plane on which the semiconductor chip is mounted.

Figure 1:
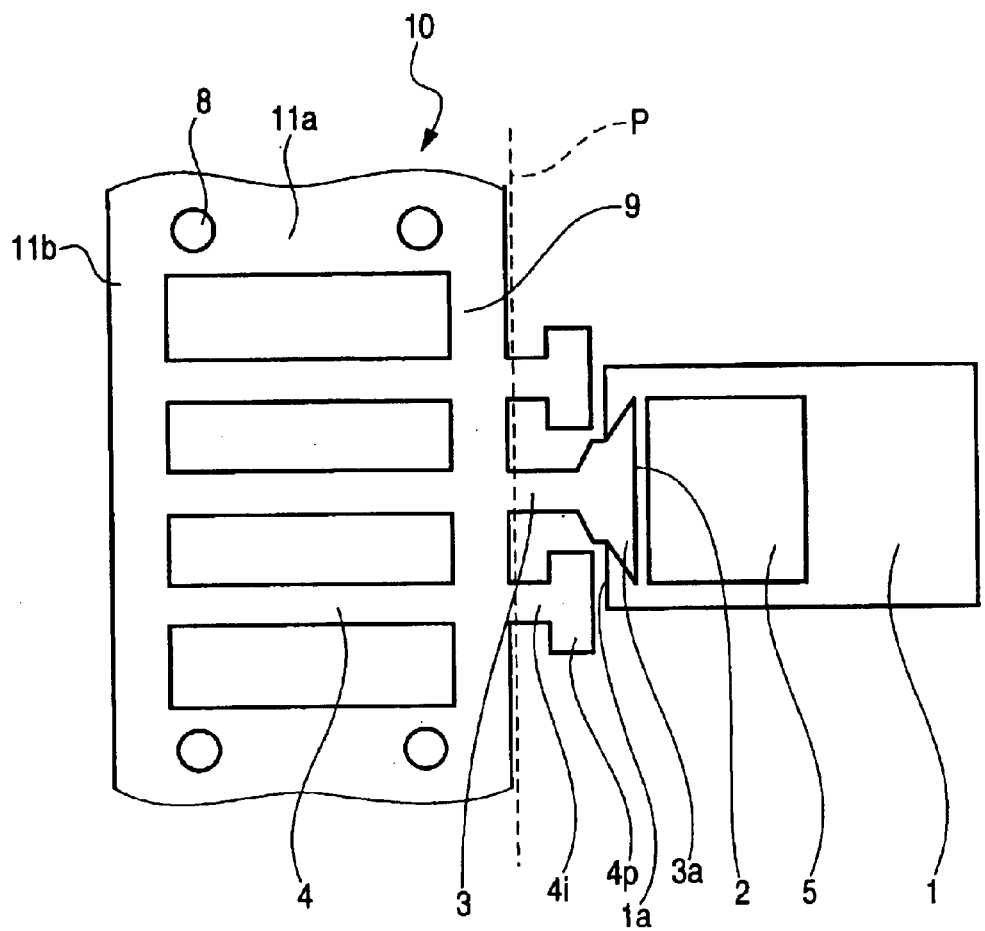
FIG. 1 is a view showing a lead frame in an embodiment of this invention.

Now referring to the drawings, an explanation will be given of an embodiment of this invention. The lead frame according to this embodiment includes a semiconductor chip mounting part 1 and a lead part 10. The semiconductor chip mounting part 1 is made of a thick-walled material having a large thickness. The lead part 10 includes a supporting lead 3 which is fit in an engagement hole 2 formed in the one side of the semiconductor chip mounting part 1 and supports the semiconductor chip mounting part 1, and an outer lead 4. Incidentally, the semiconductor chip mounting part 1 is made of a material having excellent heat radiation capability, e.g. copper, copper alloy, or the like. In the semiconductor chip mounting part 1, the other area than the area where a semiconductor chip is mounted serves as a heat-radiating fin.

The lead part 10 includes the supporting lead 3 equipped with a fitting portion 3*a* at the tip to be fit in the engagement hole 2 formed in the semiconductor chip mounting part 1, inner leads 4*i* each arranged in the vicinity of the semiconductor chip mounting part 1 so as to be connected to the semiconductor chip and having a pad area 4*p*, and outer leads 4 communicated with the inner leads 4*i*. The lead part 10 is made of a thin-walled material having a thickness of 0.15–0.6 mm and excellent workability, e.g. a copper thin plate. Each inner lead 4*i* and each outer lead 4 are integrally supported by a tie bar 9. The other ends of the outer leads 4 are coupled with one another by a frame 11*b* The extending direction of the outer leads 4 is designed by a frame 11*a* having pilot holes 8 for each unit.

The semiconductor chip mounting part 1, in the vicinity of the one side thereof, is provided with the engagement hole 2 having a wide width which is extended into the one side along the one side from the plane on which the semiconductor chip is mounted. The engagement hole 2 has a tapered side wall which becomes gradually wide. The engagement hole 2 has a maximum width much wider than that of the supporting lead 3 and equal to or greater than that of the semiconductor chip 5 to be mounted. The engagement hole 2 is opened from the central portion toward the side ends to be wider than the width of the supporting lead 3. A fitting portion 3*a*, which is formed at the tip of the supporting lead 3 so as to be wider than the width of the supporting lead 3, is caulked on the side ends 1*a* from above so as to coincide with the engagement hole 2 of the semiconductor chip mounting part 1. Thus, the semiconductor chip mounting part 1 and supporting lead 3 are coupled with each other firmly and with a position accuracy maintained stably because of the wide contact between the fitting portion 3*a* and the engagement hole 2. Symbol P denotes the package line, i.e. resin sealing end.

An explanation will be given of a method for manufacturing the lead frame.

Figure 3:
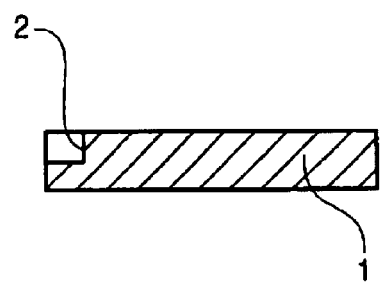
FIG. 3 is a view showing a manufacturing process of a lead frame and that of a semiconductor device in an embodiment of this invention.
Figure 3:
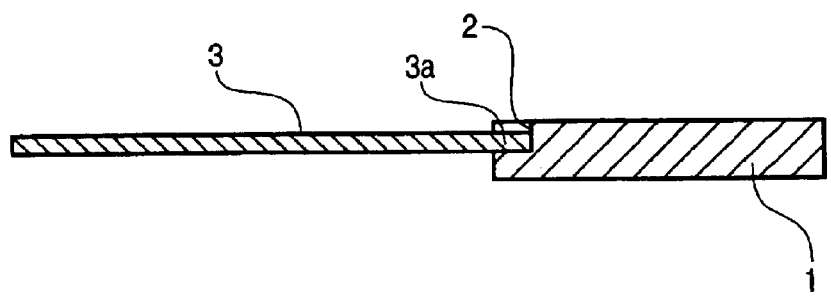
Figure 3:
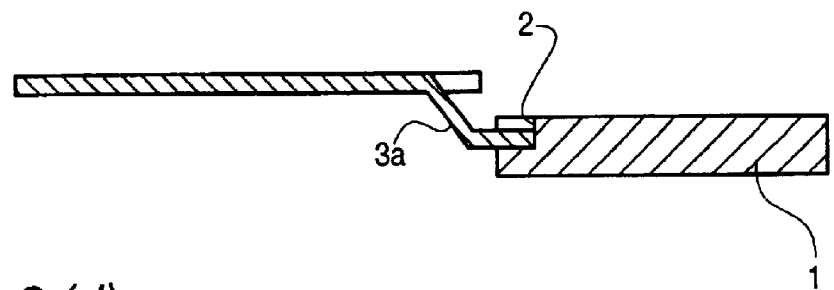
Figure 3:
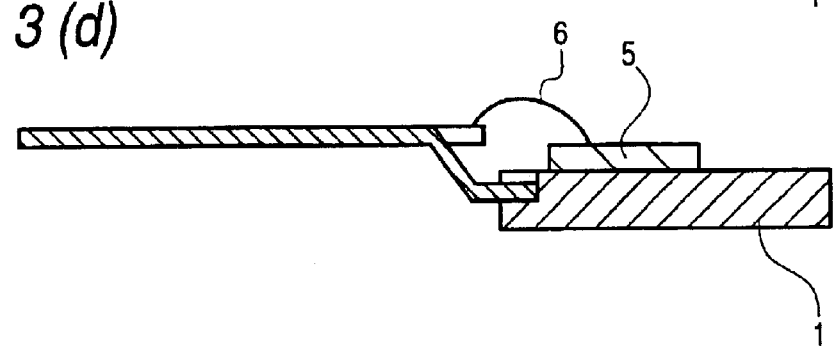
Figure 3:
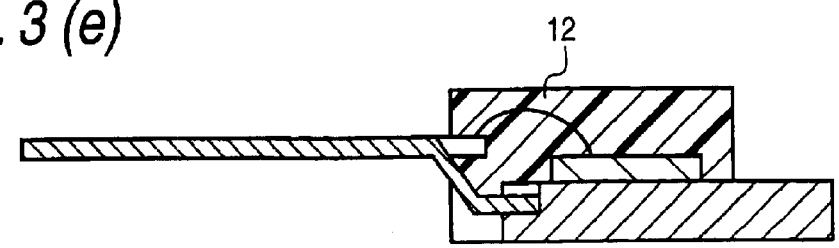

First, as shown in FIG. 3(*a*), a thick-walled copper alloy plate having a thickness of e.g. 0.8–3.0 mm is prepared. The engagement hole 2 is made and the semiconductor chip mounting part 1 is formed by punching. Incidentally, although the engagement hole 2 has a bottom, it may be a through-hole. The through-hole can be easily made by press working.

As shown in FIG. 3(*b*), a copper thin plate having e.g. a thickness of about 0.15–0.6 mm is prepared. The lead part 10 is formed by press working or etching to have the supporting lead 3, inner leads 4*i* each having the pad 4*p*, outer leads communicating with the inner leads 4*i*, tie bar 9 and frames 11*a*, 11*b*. It is preferred that the area corresponding to the pad 4*p* is plated with palladium to enhance bonding capability.

Next, as shown in FIG. 3(*c*), the fitting portion 3*a* at the tip of the supporting lead 3 in the lead part 10 is fit in the engagement hole 2 of the semiconductor chip mounting part 1. After fixing, the supporting lead 3 is bent so that the outer leads 4, inner leads 4*i*, tie bar 9, or the like other than the supporting lead 3 are located at a higher level than the semiconductor chip mounting part 1. Preferably, the bonding bad on the surface of the semiconductor chip 5 mounted on the semiconductor chip mounting part 1 is flush with the bonding pads 4*p* at the inner leads 4*i*.

Further, as shown in FIG. 3(*d*), the semiconductor chip 5 mounted on and bonded to the semiconductor chip mounting part 1 by an adhesive is wire-bonded. The semiconductor chip mounting part 1 is covered with sealing resin 12.

Finally, the tie bar 9 and frames 11*a*, 11*b* are cut and the outer leads are bent as required, thereby manufacturing a semiconductor device.

Figure 2:
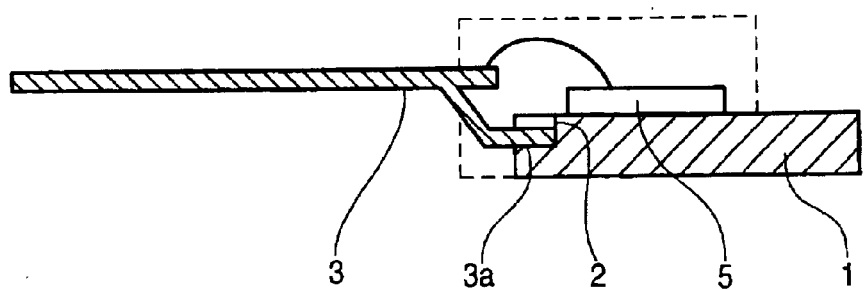
FIG. 2 is a sectional view of a lead frame in an embodiment of this invention.

The outer side of the supporting lead 3 from the area where it is caulking-coupled with the semiconductor chip mounting part 1 is bent so that the semiconductor chip mounting part 1 is located at a lower level than the supporting lead 3 (lead part 10) as shown in FIG. 2. By the wide fitting portion and the engagement hole to be engaged therewith, as described above, the supporting lead 3 is firmly coupled with the semiconductor chip mounting part 1. In addition, since the tip of the supporting lead 3 coupled with the semiconductor chip mounting part 1 which is subjected to bending is wide, the supporting lead 3 can be bent with high accuracy and good balance. Thus, the semiconductor chip mounting part 1 can be located horizontally with no inclination.

The semiconductor device thus manufactured is good in heat, radiation, high in bonding capability, and hence can have high accuracy and reliability.

Further, since the sealing resin also enters the concave portion at the coupled portion between the semiconductor chip mounting part 1 and lead part 10, dropouts of the resin are difficult to occur and hence packaging can be performed with high reliability.

Figure 4:
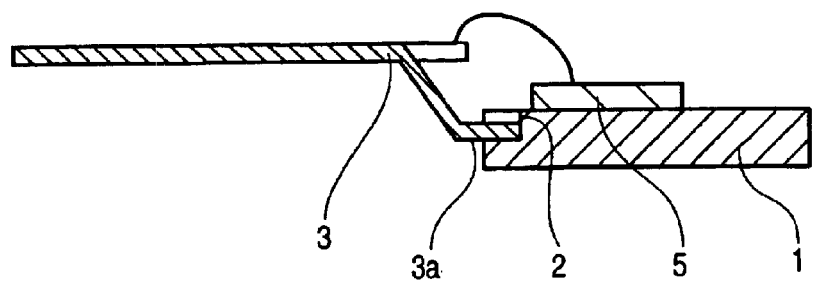
FIG. 4 is a view showing a modification of the lead frame in an embodiment of this invention.

Further, since the supporting lead 3 is firmly coupled with the semiconductor chip mounting part 1 as described above, the supporting lead 3 can be subjected to deep bending so that the semiconductor chip mounting part 1 can be located further downward as shown in FIG. 4. Thus, the supporting lead 3 can be molded so that the pad 4*p* at the tip of the inner lead 4*i* is located at a higher level than the surface of the semiconductor chip 5, thereby improving the bonding capability. Further, since the bonding wire 6 does not touch with the supporting lead 3, the semiconductor chip 5 which is thick and highly integrated can be also mounted stably.

Figure 5:
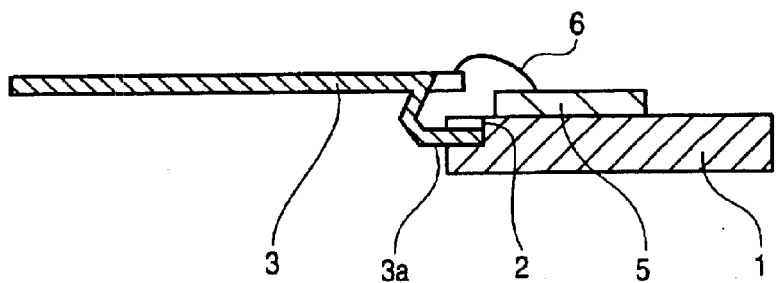
FIG. 5 is a view showing a modification of the lead frame in an embodiment of this invention.

Since the supporting lead 3 is formly coupled with the semiconductor chip mounting part 2 as described above, as shown in FIG. 5, the supporting lead 3 can be bent in a U-shape so that the one end of the semiconductor chip mounting part 1 is located below the outer lead 4 of the lead part 10. Thus, the bonding wire 6 to be connected to the semiconductor chip 5 can be further shortened.

Further, direct bonding can be made so that the tip of the inner lead 4i is located on the bonding pad of the semiconductor chip 5.

Figure 6:
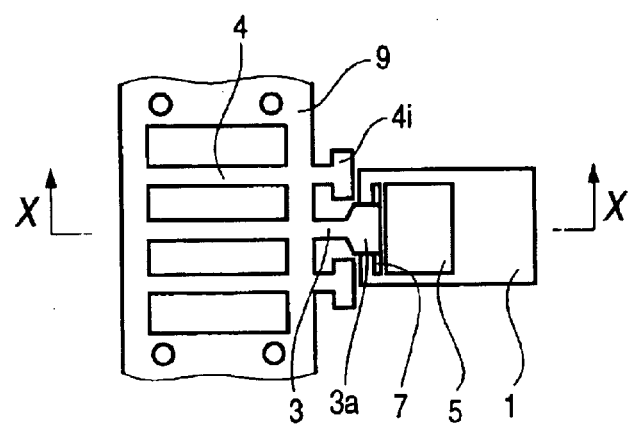
FIG. 6 is a view showing a lead frame in a second embodiment of this invention.

Next, as a second embodiment of this invention, referring to FIGS. 6 and 7, an explanation will be given of a modification of the caulking-coupled portion between the semiconductor chip mounting part 1 and the supporting lead 3. A through-hole 7 is made in the one side along the one side of the semiconductor chip mounting part 1 so as to have a width equal to or longer than that of the semiconductor chip 5. An opening is formed from the center position of the through-hole 7 toward the ends of the one side so as to be wider than the lead width of the supporting lead 3.

In the through-hole 7 and the opening between the side ends, a fitting portion 3a, which is formed at the tip of the supporting lead 3 and has a wider width than that of the supporting lead 3, is caused to sink and caulked. Thus, the semiconductor chip mounting part 1 and the supporting lead 3 are coupled with each other.

Figure 7:
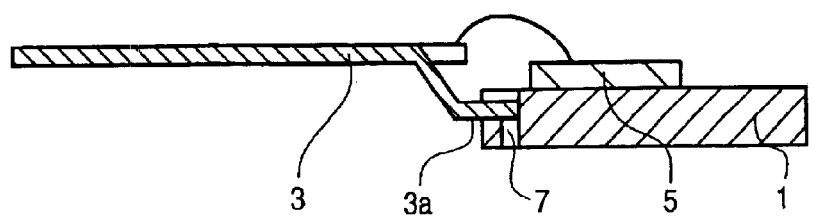
FIG. 7 is a side sectional view of a lead frame taken in line X—X in FIG. 6 in the second embodiment of this invention.

Above the through-hole 7 where the fitting portion 3a sinks, as shown in FIG. 7, toward the supporting lead 3 from the plane on which the semiconductor chip is mounted, a groove is formed to have a width equal to or longer than that of the semiconductor chip.

The supporting lead 3 coupled with the semiconductor chip mounting part 1 is subject to the above bending to have a desired shape. On the semiconductor chip mounting part 1, an adhesive is applied for die-bonding the semiconductor chip 5. The adhesive tends to flow out from a semiconductor chip mounting area toward the supporting lead 3. However, on the side of the coupled supporting lead of the semiconductor chip mounting part 1, the above groove is made to have a width equal to or longer than that of the semiconductor chip 5. Therefore, the adhesive is prevented from flowing out toward the shopping lead 3, and the reliability of die-bonding of the semi-conductor chip 5 can be improved.

Figure 8:
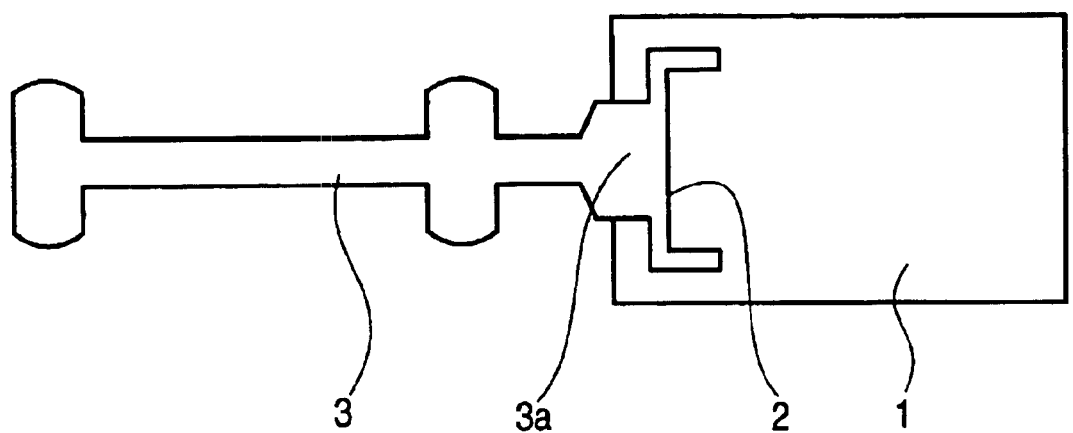
FIG. 8 is a view showing a modification of the lead frame according to this invention.

The shape of the engagement hole 2 formed on the one side of the semiconductor chip mounting part 1 should not be limited to a trapezoidal shape as adopted in the first embodiment, but may be a U-shape as shown in FIG. 8 as long as it has a wider width than that of the supporting lead 3.

In such a configuration also, the semiconductor device with high accuracy and high reliability can be provided.

Further, the lead part and the semiconductor chip mounting part can be also coupled with each other through an insulating material. This permits the supporting lead to be employed as the inner lead and outer lead to be communicated therewith.

Furthermore, the supporting lead may be located within only the sealing resin and not be employed as a connecting terminal.

INDUSTRIAL APPLICABILITY

In accordance with this invention, an engagement hole having a wider width than that of the supporting lead is made into the one side along the one side of the semiconductor chip mounting part made of a thick walled material, and is opened from the central portion toward the side ends to be wider than the width of the supporting lead. A fitting portion, which is formed at the tip of the supporting lead so as to be wider than the supporting lead, is caulked on the engagement hole and at the side ends thereof. Therefore, the semiconductor chip mounting part and the supporting lead are firmly coupled with each other. Further, the supporting lead, which supports the semiconductor chip mounting part has a tip with a wide width, can be bent with no inclination. The semiconductor chip mounting part has an improved horizontal degree and can be attached to a separate heat radiation plate so that its entirety is kept in intimate contact with the radiation plate.

In accordance with the above configuration, since the fitting portion is firmly coupled with the semiconductor chip mounting part over a wide area, the supporting lead can be bent deeply. Therefore, a semiconductor chip which has a large chip thickness and is highly integrated can be mounted on the semiconductor chip mounting part. The length of the bonding wire for the semiconductor chip thus mounted can be shortened. Furthermore, the resin used when the semiconductor chip is sealed enters the deep concave portion formed by bending of the supporting lead so that the contact degree between the resin and the supporting lead can be improved greatly.

In accordance with this invention, a through-hole is made in the one side along the one side of the semiconductor chip mounting part made of a thick-walled material so as to have a width equal to or longer than that of the semiconductor chip to be mounted and is opened from the center position of the through-hole toward the ends of the one side so as to be wider than the lead width of the supporting lead.

In the through-hole 7 and at the side ends thereof, a fitting portion, which is formed at the tip of the supporting lead and has a wider width that of the lead width, is caused to sink and caulked. Thus, the semiconductor chip mounting part 1 and the supporting lead 3 are coupled with each other. In addition, the through-hole forms a groove so that the adhesive when the semiconductor chip is die-bonded can be prevented from flowing out toward the supporting lead, and the reliability of die-bonding of the semiconductor chip can be improved.

What is claimed is:

1. A lead frame comprising:

a semiconductor chip mounting part made of a thick-walled material;

a supporting lead made of a thin-walled material which supports said semiconductor chip mounting part and also serves as an outer lead; and an outer lead arranged in parallel to the supporting lead, wherein a through-hole is made in one side along the one side of the semiconductor chip mounting part so as to have a width equal to or longer than that of a semiconductor chip to be mounted; an opening is formed from a center position of the through-hole toward ends of the one side so as to be wider than a width of the supporting lead; and in the through-hole and the opening between the side ends, a fitting portion having a wider width than the supporting lead, which is formed at the tip of the supporting lead, is fit to sink relative to the surface of the semiconductor chip mounting part so that the semiconductor chip mounting part and the supporting lead is coupled and the through-hole forms a groove from the plane on which the semiconductor chip is mounted.

2. The lead frame as claimed in claim 1, wherein the tip of the supporting lead which has a wider width than that of the supporting lead where it is coupled with said semiconductor chip mounting part is bent at a location where the tip of the supporting lead has a wider width than that of the supporting lead so that a surface of the semiconductor chip mounting part is located at a lower level than an extending line of said supporting lead, or the one end thereof is located at a lower surface of the supporting lead.

3. The lead frame according to claim 1 further comprising a semiconductor chip mounted on the semiconductor chip mounting part.

4. A lead frame comprising:
   a semiconductor chip mounting part made of a thick-walled material having a surface to which a semiconductor chip can be mounted;
   a supporting lead made of a thin-walled material which supports said semiconductor chip mounting part and also serves as an outer lead; and
   an outer lead arranged in parallel to the supporting lead;
   wherein an engagement hole having a wider width than that of the supporting lead is made into one side along the one side of the semiconductor chip mounting part, and is opened from a central portion toward the side ends to be wider than the width of the supporting lead; a fitting portion, which is formed at a tip of the supporting lead, is caulked on the engagement hole and at the side ends thereof so that the supporting lead is coupled with the semiconductor chip mounting part, and a tip portion of the supporting lead with a wider width than that of the supporting lead, is led out from the area where it is coupled with the semiconductor chip mounting part, the tip portion bent at a location where the tip portion has a wider width than that of the supporting lead so that a surface of the semiconductor chip mounting part is located at a lower level than an extending line of said supporting lead, or one end thereof is located at a lower surface of the supporting lead.

* * * * *